US012635438B2

(12) United States Patent
Oh et al.

(10) Patent No.: US 12,635,438 B2
(45) Date of Patent: May 19, 2026

(54) OFFSET DATA CORRECTION METHOD AND SEMICONDUCTOR DEVICE MANUFACTURING METHOD INCLUDING THE SAME

(71) Applicant: Samsung Electronics Co., Ltd., Suwon-si (KR)

(72) Inventors: Joongsuk Oh, Suwon-si (KR); Jinuk Byun, Suwon-si (KR); Hoyoung Kim, Suwon-si (KR); Hyunkyu Moon, Suwon-si (KR); Kiho Bae, Suwon-si (KR); Boun Yoon, Suwon-si (KR); Hojoon Lee, Suwon-si (KR); Seunghoon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 292 days.

(21) Appl. No.: 18/633,627

(22) Filed: Apr. 12, 2024

(65) Prior Publication Data
US 2025/0022713 A1 Jan. 16, 2025

(30) Foreign Application Priority Data

Jul. 14, 2023 (KR) ........................ 10-2023-0092038
Sep. 21, 2023 (KR) ........................ 10-2023-0126468

(51) Int. Cl.
| | |
|---|---|
| *H10P 52/00* | (2026.01) |
| *G06N 3/04* | (2023.01) |
| *H10P 72/00* | (2026.01) |
| *H10P 74/20* | (2026.01) |

(52) U.S. Cl.
CPC ............... *H10P 52/00* (2026.01); *G06N 3/04* (2013.01); *H10P 72/06* (2026.01); *H10P 74/203* (2026.01)

(58) Field of Classification Search
None
See application file for complete search history.

(56) References Cited

U.S. PATENT DOCUMENTS

| | | | |
|---|---|---|---|
| 6,885,467 | B2 | 4/2005 | Du-Nour et al. |
| 10,576,603 | B2 | 3/2020 | Vukkadala et al. |
| 10,732,607 | B2 | 8/2020 | Cherian |
| 11,562,919 | B2 | 1/2023 | Wang et al. |
| 11,580,375 | B2 | 2/2023 | Bhaskar et al. |
| 2018/0364028 | A1 | 12/2018 | Piel et al. |
| 2020/0057388 | A1* | 2/2020 | Sun ........................ G03F 7/7065 |
| 2022/0412734 | A1* | 12/2022 | Pandev .................. G01B 21/24 |

FOREIGN PATENT DOCUMENTS

| | | |
|---|---|---|
| CN | 113808189 A | 12/2021 |
| WO | 2022-180827 A1 | 9/2022 |

* cited by examiner

*Primary Examiner* — Roberts P Culbert
(74) *Attorney, Agent, or Firm* — Muir Patent Law, PLLC

(57) ABSTRACT

An offset data correction method includes measuring a measurement target that has undergone a chemical mechanical polishing (CMP) process, generating an offset correction model based on the measurement of the measurement target, and using the offset correction model, correcting measured data obtained from the measurement of the measurement target, wherein the offset correction model is trained by using the measured data and layout data of the measurement target as inputs.

20 Claims, 12 Drawing Sheets

10

100

200

SEMICONDUCTOR MEASURING DEVICE

OFFSET DATA CORRECTION SYSTEM

OFFSET DATA CORRECTION METHOD AND SEMICONDUCTOR DEVICE MANUFACTURING METHOD INCLUDING THE SAME

CROSS-REFERENCE TO RELATED APPLICATIONS

This application is based on and claims priority under 35 U.S.C. § 119 to Korean Patent Application Nos. 10-2023-0092038, filed on Jul. 14, 2023 and 10-2023-0126468, filed on Sep. 21, 2023, in the Korean Intellectual Property Office, the disclosures of which are incorporated by reference herein in their entirety.

BACKGROUND

The inventive concept relates to an offset data correction method and a semiconductor device manufacturing method including the same, and more particularly, to an offset data correction method including a chemical mechanical polishing (CMP) process and a semiconductor device manufacturing method including the offset data correction method.

In the manufacture of semiconductor devices, a CMP process is usually used to polish the surface of a semiconductor device including highly integrated elements. With the increase in the integration density of semiconductor devices, it is increasingly important to increase the reliability of a polishing process for the manufacture of micropatterns, and accordingly, it is desired to develop technology for measuring the quality of a CMP process. In general, in order to check a large-area offset by using an optical method after a CMP process, an additional process of forming a metal film on a measurement target (e.g., a semiconductor device) is performed.

SUMMARY

The inventive concept provides an offset data correction method, by which measured data is corrected with high reliability with respect to a chemical mechanical polishing (CMP) process, and a semiconductor device manufacturing method including the same.

The inventive concept is not limited to those mentioned above, and the inventive concept that has not been mentioned will be clearly understood by one of skill in the art from the description below.

According to an aspect of the inventive concept, there is provided an offset data correction method including measuring a measurement target that has undergone a chemical mechanical polishing (CMP) process; generating an offset correction model based on the measurement of the measurement target; and using the offset correction model, correcting measured data obtained from the measurement of the measurement target, wherein the offset correction model is trained by using the measured data and layout data of the measurement target as inputs.

According to another aspect of the inventive concept, there is provided an offset data correction method including measuring a measurement target that has undergone a chemical mechanical polishing (CMP) process; pre-processing measured data obtained from the measurement of the measurement target; generating an offset correction model based on the measured data; and correcting the measured data, wherein the pre-processing of the measured data includes: combining the measured data with layout data of the measurement target; converting a size of a layout unit of the layout data; and classifying the measured data and the layout data, and the offset correction model is trained by using the measured data and the layout data as inputs.

According to a further aspect of the inventive concept, there is provided a semiconductor device manufacturing method including preparing a wafer; performing a chemical mechanical polishing (CMP) process on the wafer; evaluating the CMP process; and performing a subsequent semiconductor process on the wafer, wherein the evaluating of the CMP process includes: measuring the wafer that has undergone the CMP process; generating an offset correction model based on the measurement of the wafer; and using the offset correction model, correcting measured data obtained from the measurement of the wafer, wherein the offset correction model is trained by using the measured data and layout data from another wafer as inputs.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
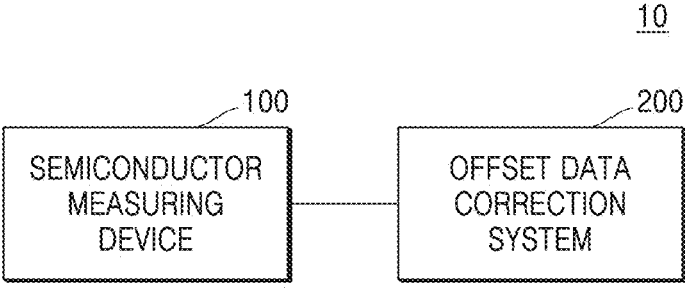
FIG. 1 is a block diagram of a semiconductor device manufacturing apparatus according to an embodiment.

Hereinafter, embodiments are described in detail with reference to the accompanying drawings. In the drawing, like reference characters denote like elements, and redundant descriptions thereof will be omitted.

FIG. 1 is a block diagram of a semiconductor device manufacturing apparatus according to an embodiment.

Referring to FIG. 1, a semiconductor device manufacturing apparatus 10 may include a semiconductor measuring device 100 and an offset data correction system 200. After performing a semiconductor process on a wafer, the semiconductor device manufacturing apparatus 10 may correct data, which is obtained through the semiconductor measuring device 100, by using the offset data correction system 200. In detail, the semiconductor measuring device 100 may obtain height and/or offset information with respect to a measurement target and the offset data correction system 200 may correct the data obtained by the semiconductor measuring device 100.

The semiconductor measuring device 100 may measure various patterns of a wafer. For example, the semiconductor measuring device 100 may inspect the flatness, thickness, height, offset, alignment, and/or surface quality of a pattern on a wafer. The semiconductor measuring device 100 may measure an area having a horizontal width of several millimeters. Accordingly, the semiconductor measuring device 100 may quickly measure a measurement target (e.g., a wafer).

For example, the semiconductor measuring device 100 may include an interferometer and measure various patterns of a wafer. The interferometer may measure the height and/or thickness of a measurement target (e.g., a pattern of a wafer) by using the interference properties of waves. In detail, the interferometer may measure the path difference between reference light and reflected light reflected from a measurement target by using the interference pattern between the reference light and the reflected light. The interferometer may measure the thickness, height, and/or offset of the measurement target based on the path difference.

However, when a measurement target to be measured includes various materials, the reliability of data of the semiconductor measuring device 100 may be relatively low. For example, when a measurement target includes a material (e.g., silicon) having high light transmittance, light incident to the material may pass through the material and interfere with an element below the material, thereby causing noise. Accordingly, it is desirable to perform post-processing (correction) on the measured data of the semiconductor measuring device 100.

The offset data correction system 200 may inspect the flatness, thickness, and/or surface quality of a pattern on a wafer based on the measured data of the semiconductor measuring device 100. In other words, the offset data correction system 200 may increase the reliability of data generated by the semiconductor measuring device 100.

As described below, the offset data correction system 200 may post-process data generated by the semiconductor measuring device 100, based on an artificial intelligence (AI) model. For example, the offset data correction system 200 may post-process data generated by the semiconductor measuring device 100, based on machine learning and/or deep learning. Even when a measurement target includes various materials, the offset data correction system 200 may inspect the flatness, thickness, height, offset, and/or surface quality of the measurement target with high reliability. Data post-processing performed by the offset data correction system 200 is described in detail with reference to FIGS. 5 to 9.

For example, the semiconductor measuring device 100 and the offset data correction system 200 may measure an offset after a chemical mechanical polishing (CMP) process. A CMP process and an offset measuring method are described in detail with reference to FIGS. 2 to 4 below.

Figure 2:
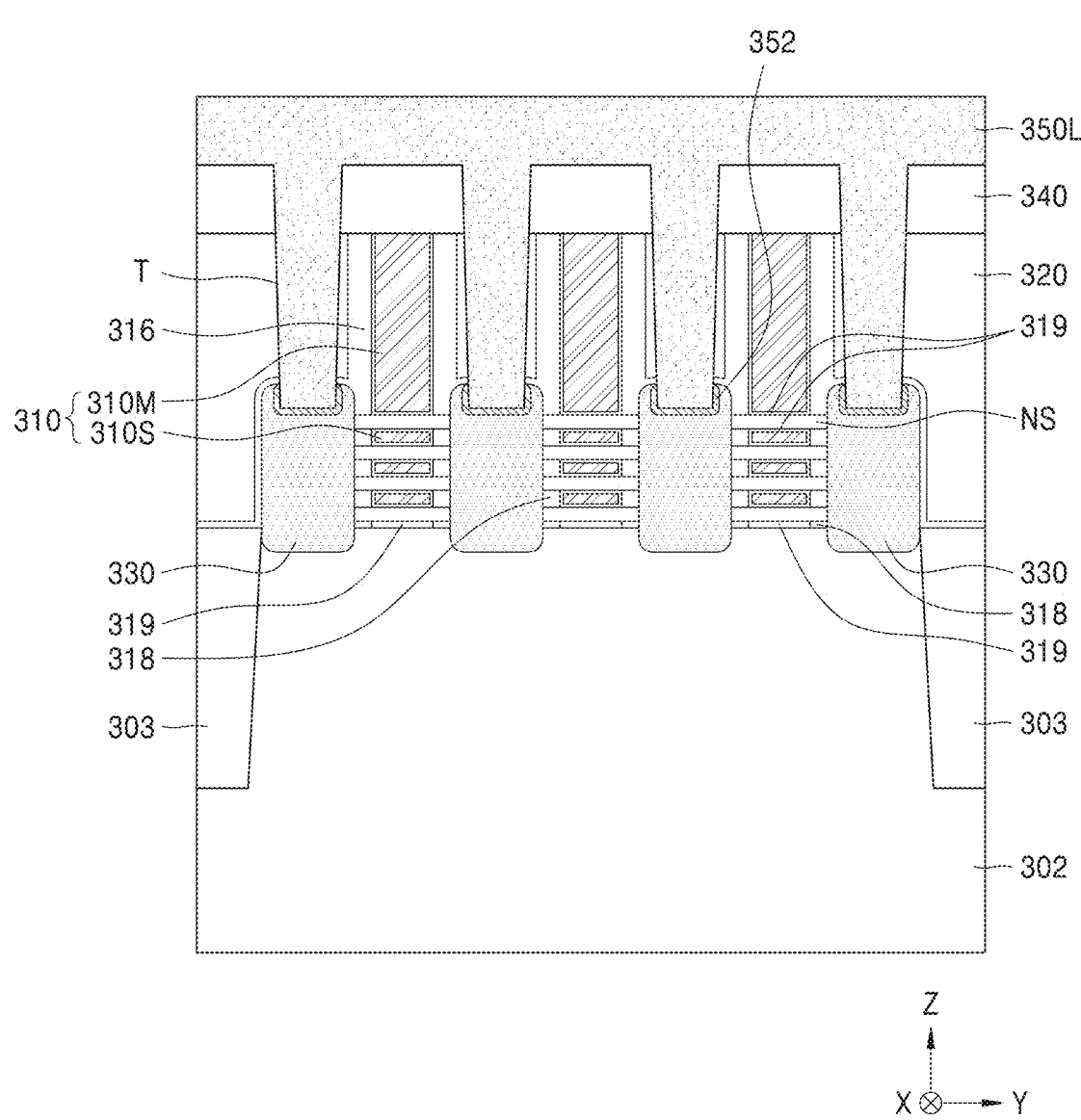
FIGS. 2 and 3 are cross-sectional views illustrating a chemical mechanical polishing (CMP) process according to an embodiment.
Figure 3:
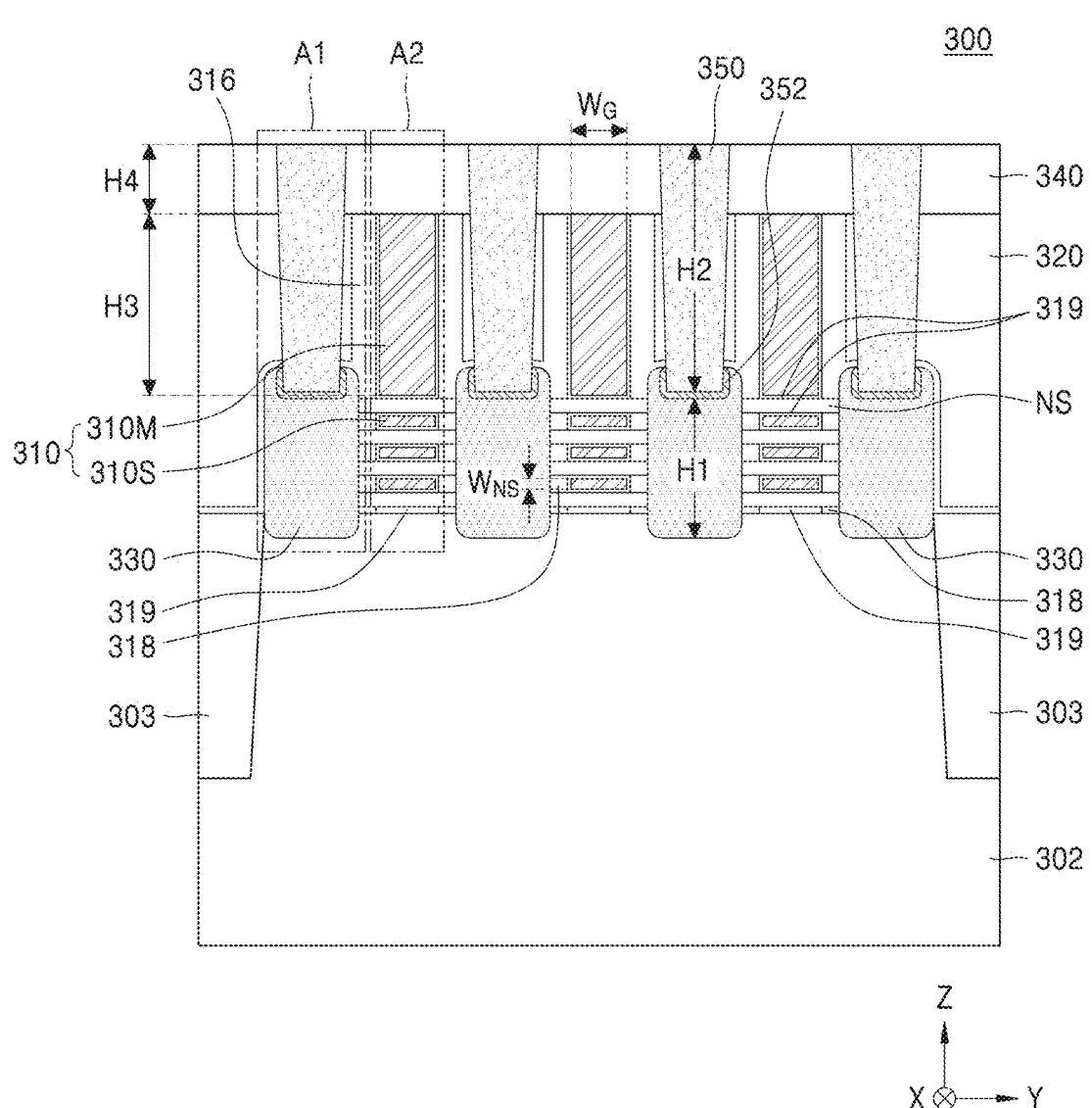
Figure 4:
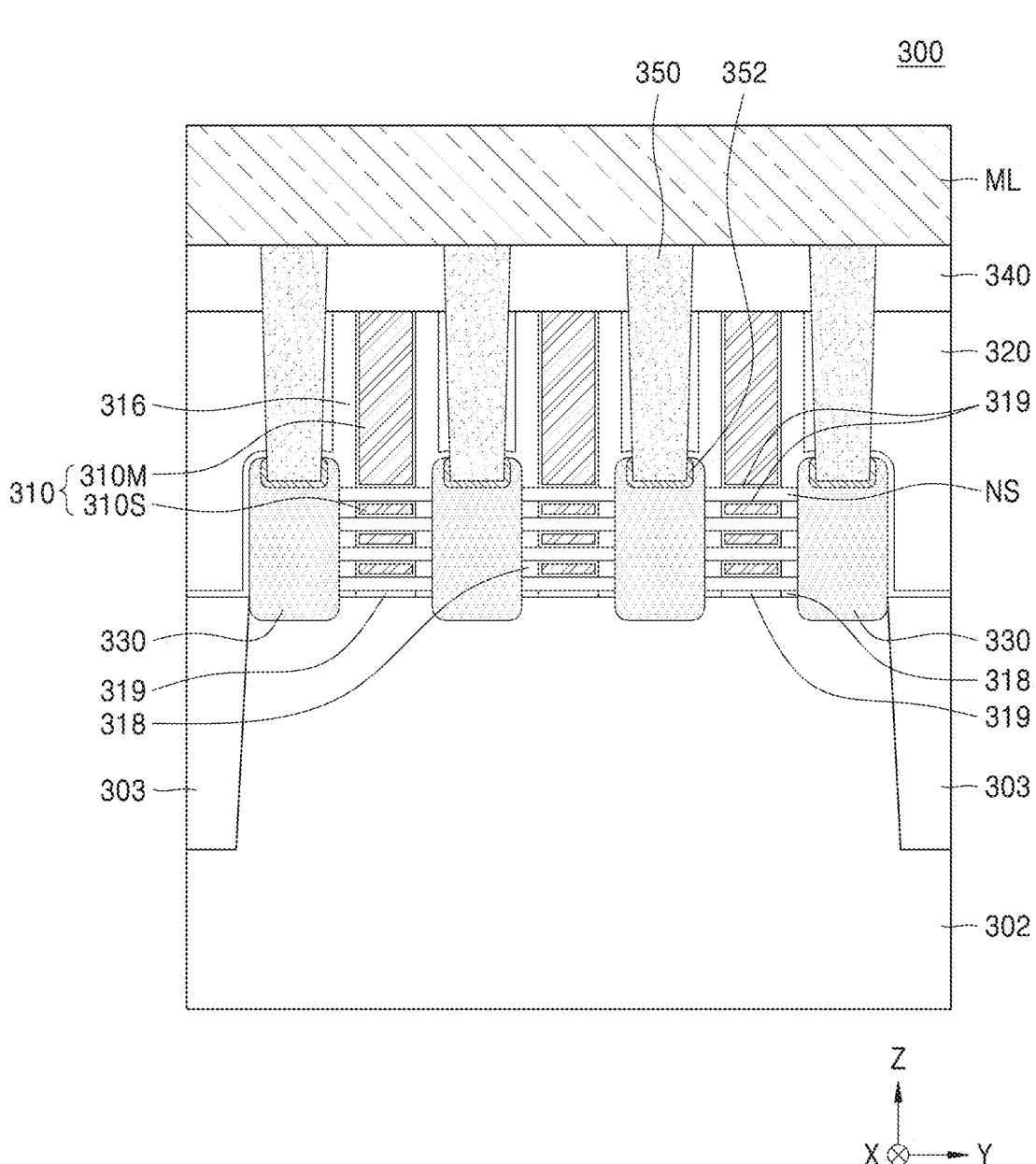
FIG. 4 is a cross-sectional view illustrating a metal film formed on a semiconductor device of FIG. 3, according to an embodiment.

FIGS. 2 and 3 are cross-sectional views illustrating a CMP process according to an embodiment. FIG. 4 is a cross-sectional view illustrating a metal film formed on a semiconductor device of FIG. 3, according to an embodiment.

Referring to FIGS. 2 to 4, a semiconductor device 300 may include a substrate 302, an isolation film 303, a metal gate 310, a spacer 316, an inter-sheet spacer 318, a gate dielectric film 319, an interlayer insulating film 320, a source/drain region 330, an upper interlayer insulating film 340, a contact plug 350, and a nanoshect NS. Although it is illustrated in FIGS. 2 to 4 that the semiconductor device 300 has a gate-all-around (GAA) memory structure, the types of elements included in the semiconductor device 300 are not limited thereto.

The source/drain region 330 and the nanoshect NS may be arranged in a horizontal direction (the X direction and/or the Y direction) on the substrate 302 including the isolation film 303. Here, the horizontal direction (the X direction and/or the Y direction) may refer to a direction parallel with a main surface of the substrate 302 and the vertical direction (the Z direction) may refer to a direction perpendicular to the horizontal direction (the X direction and/or the Y direction).

The metal gate 310 may include a main gate 310M and a sub gate 310S. The main gate 310M may be arranged on the nanosheet NS. Sub gates 310S and nanosheets NS may be alternately stacked in the vertical direction (the Z direction). The metal gate 310 may be surrounded by the gate dielectric film 319.

The spacer 316 may cover opposite sidewalls of a gate structure, which includes the metal gate 310 and the gate dielectric film 319. The inter-sheet spacer 318 may be between the substrate 302 and a nanosheet NS and/or between nanosheets NS adjacent to each other in the vertical direction (the Z direction) and may cover the substrate 302 and the nanosheets NS.

The contact plug 350 may be on the source/drain region 330. A metal silicide film 352 may be between the source/drain region 330 and the contact plug 350. The metal gate 310 and the contact plug 350 may be formed of or include metal. The upper interlayer insulating film 340 may be on the main gate 310M. For example, the upper interlayer insulating film 340 may be formed of or include silicon nitride.

As shown in FIG. 2, a contact plug-forming conductive layer 350L may be formed to fill a trench T on the source/drain region 330 and cover the upper interlayer insulating film 340. The contact plug-forming conductive layer 350L may be formed of or include metal, metal nitride, metal carbide, or a combination thereof. The contact plug-forming conductive layer 350L may be formed by atomic layer deposition (ALD).

Referring to FIG. 3, the contact plug 350 may be formed by removing an upper portion of the contact plug-forming conductive layer 350L such that the top surface of the upper interlayer insulating film 340 is exposed. Because the contact plug 350 is formed by removing the upper portion of the contact plug-forming conductive layer 350L, the contact plug 350 may be formed of or include metal, metal nitride, metal carbide, or a combination thereof.

Here, the upper portion of the contact plug-forming conductive layer 350L may be removed by CMP. The quality of a CMP process may be evaluated according to height information and/or offset information of the semiconductor device 300.

As described above, the semiconductor measuring device 100 may measure the height of a measurement target by enabling light to be reflected from the measurement target. However, because a silicon (Si)-based layer transmits light, interference by a lower layer (e.g., the metal gate 310) may occur when the semiconductor measuring device 100 measures the semiconductor device 300.

Accordingly, to prevent light from being transmitted by a silicon-based layer, a material having a step coverage effect and a high absorption coefficient may be formed on the semiconductor device 300. For example, as shown in FIG. 4, a metal film ML may be formed on the semiconductor device 300 before the height and/or offset of the semiconductor device 300 is measured. For example, the metal film ML may be formed of or include aluminum (Al), tungsten (W), TiN, and/or TaN. The metal film ML may be formed on the semiconductor device 300 to a thickness of about 10 nm to about 100 nm.

When the semiconductor measuring device 100 measures the semiconductor device 300 having the metal film ML formed thereon, the semiconductor measuring device 100 may measure the height and/or offset of the semiconductor device 300 with high reliability. At this time, the semiconductor measuring device 100 may measure the semiconductor device 300 by using destructive analysis. Moreover, due to the additional process of forming the metal film ML, the turnaround time (TAT) for semiconductor device manufacturing may increase.

Therefore, the inventive concept provides an offset data correction method. A first process of training an offset correction model may include the formation of a metal film ML on the semiconductor device 300 to generate the second data. A second process of evaluating a different semiconductor device 300 may be performed using the offset correction model that has been trained by the first process.

Figure 5:
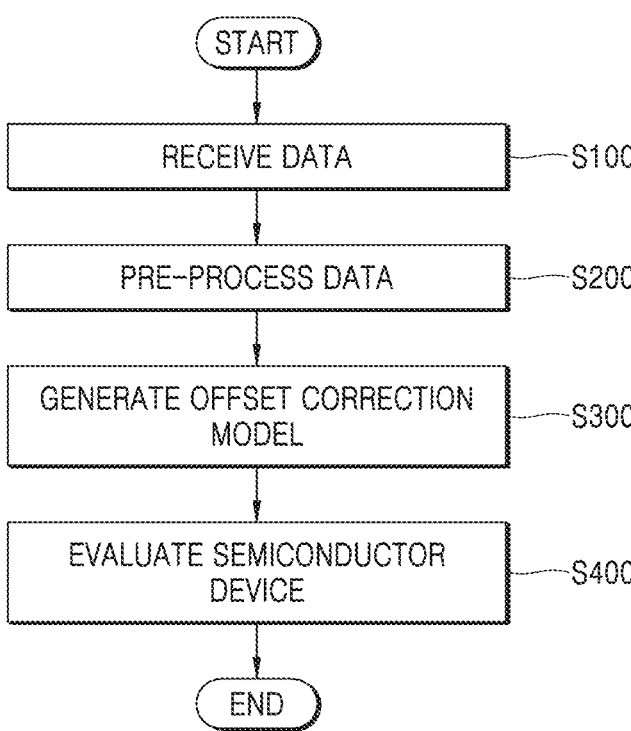
FIG. 5 is a flowchart of an offset data correction method according to an embodiment.

FIG. 5 is a flowchart of an offset data correction method according to an embodiment. FIG. 5 is described with reference to FIGS. 1 to 4.

Referring to FIG. 5, data may be received in operation S100. The data may be generated by the semiconductor measuring device 100 and input to the offset data correction system 200. Here, the data may include data obtained by measuring the semiconductor device 300 of FIG. 3 using the semiconductor measuring device 100 and data obtained by measuring the semiconductor device 300 of FIG. 4, which has the metal film ML formed thereon, using the semiconductor measuring device 100. The data obtained by measuring the semiconductor device 300 of FIG. 3 using the semiconductor measuring device 100 may be referred to as first data. The data obtained by measuring the semiconductor device 300 of FIG. 4, which has the metal film ML formed thereon, using the semiconductor measuring device 100 may be referred to as second data. For example, the semiconductor measuring device 100 and the offset data correction system 200 may be connected to each other through a network so that data may be transmitted between the semiconductor measuring device 100 and the offset data correction system 200.

Thereafter, the data may be pre-processed in operation S200. The pre-processing of the data is described in detail with reference to FIG. 6.

Figure 6:
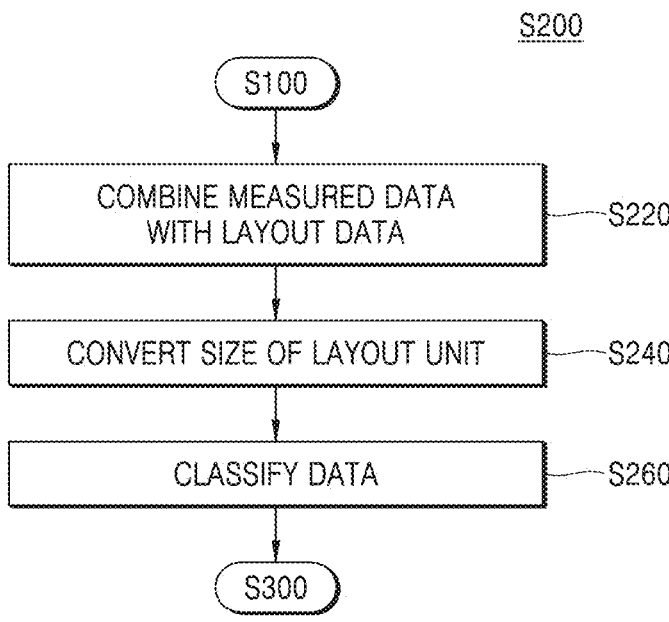
FIG. 6 is a flowchart of a data pre-processing method according to an embodiment.

FIG. 6 is a flowchart of a data pre-processing method according to an embodiment. Here, data to be pre-processed may be the first data.

Referring to FIG. 6, the offset data correction system 200 may combine measured data with layout data in operation S220. For example, the measured data may be labeled with the layout data. The layout data may represent measuring conditions of the measured data. The offset data correction system 200 may receive the layout data of a measurement target. The layout data may include information about a constituent material, a dimension, a shape, and/or a contact at each of different positions and/or the function of each of elements of the semiconductor device 300. The data measured by the semiconductor measuring device 100 may be referred to as measured data to be distinguished from the layout data.

Thereafter, the offset data correction system 200 may convert the size of a layout unit in operation S240. The layout unit may be a portion of the layout data of the measurement target. The conversion of the size of the layout unit is described in detail with reference to FIGS. 7 and 8.

Figure 7:
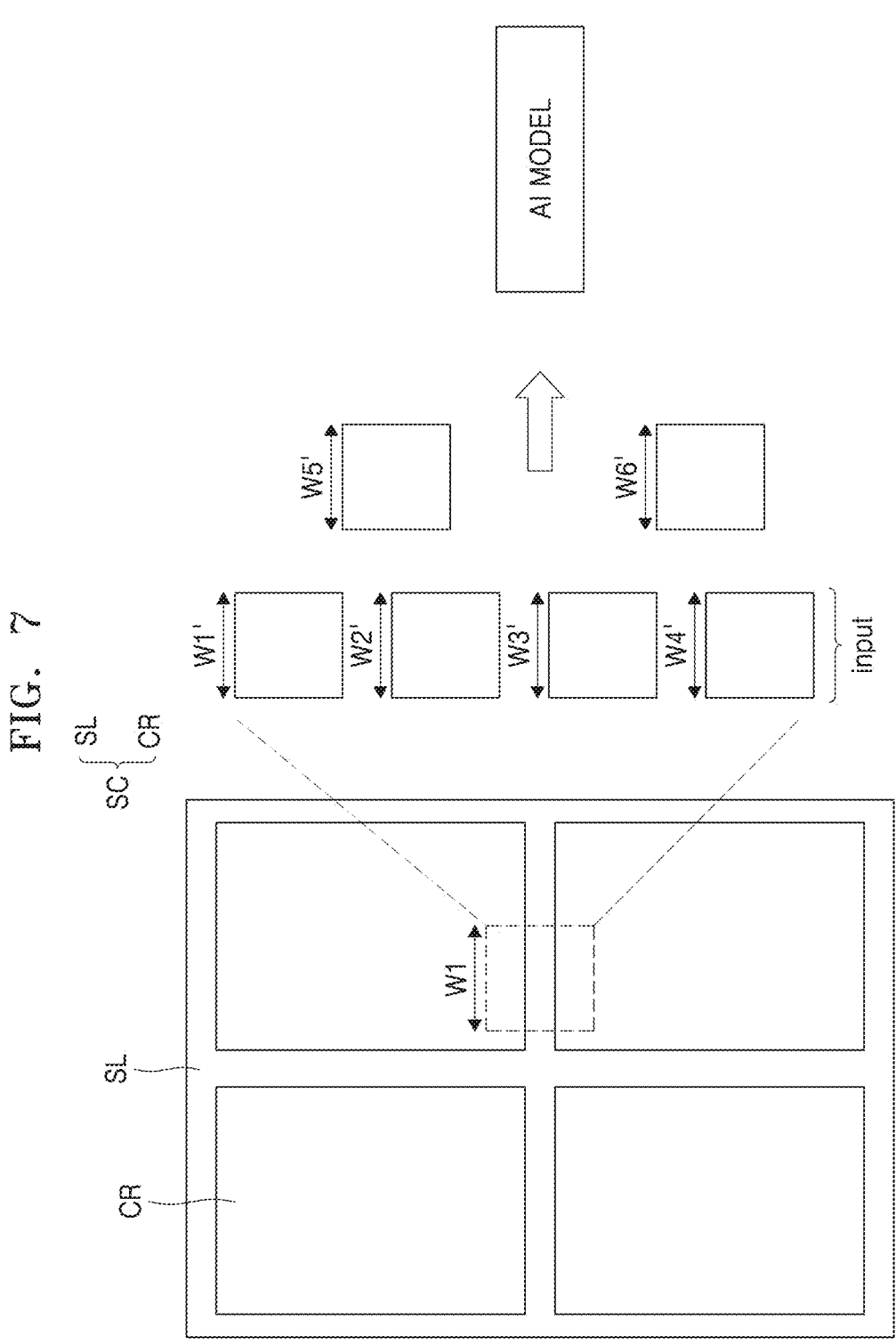
FIG. 7 is a diagram illustrating pre-processing of data, according to an embodiment.
Figure 8:
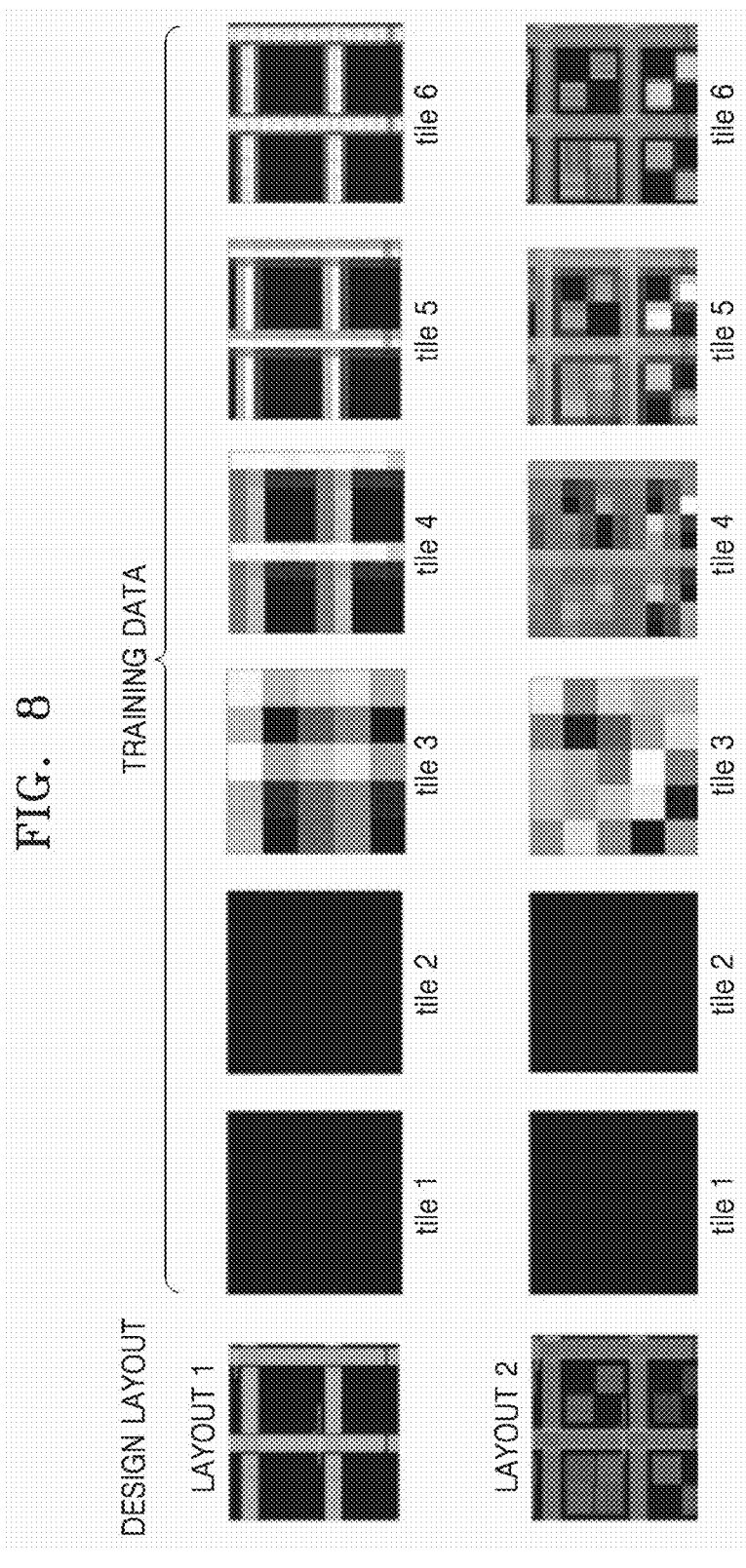
FIG. 8 is a conceptual diagram illustrating the relationship between a horizontal width and a resolution of a layout, according to an embodiment.

FIG. 7 is a diagram illustrating pre-processing of data, according to an embodiment. FIG. 8 is a conceptual diagram illustrating the relationship between a horizontal width and a resolution of a layout, according to an embodiment.

Referring to FIG. 7, a semiconductor chip SC is used as a measurement target. The semiconductor chip SC may include a chip region CR and a scribe lane region SL. Functional elements, such as a transistor, a logic gate, a memory cell, and/or an interconnection structure, of an integrated circuit may be arranged in the chip region CR. The scribe lane region SL may surround the chip region CR and separate a plurality of chip regions CR from each other.

Because elements arranged in the chip region CR include different constituent materials than elements arranged in the scribe lane region SL, the chip region CR and the scribe lane region SL may be classified (e.g., differentiated). For example, the chip region CR and the scribe lane region SL may be differentiated by recognizing whether each position belongs to the chip region CR or the scribe lane region SL based on layout data. For example, different offset correction models may be generated and used for the different regions of the semiconductor chip SC.

A first layout unit having a first horizontal width (scale) W1 may be converted into second layout units having different horizontal widths. For example, the second layout units may respectively have first to sixth horizontal widths W1', W2', W3', W4', W5', and W6'. Although it is illustrated in FIGS. 7 and 8 that the first layout unit is converted into six second layout units, the inventive concept is not limited thereto. For example, the first layout unit may be converted into five or less second layout units or at least seven second layout units.

Here, the size of the first layout unit may be the same as the size of resolution of the semiconductor measuring device 100. The size of at least some of the second layout units may be greater than the size of the first layout unit and the size of at least some of the second layout units may be less than the size of the first layout unit. A plurality of second layout units having different sizes may be selected as input data. The plurality of second layout units may be generated by converting a resolution of the first layout unit and/or a width of the first layout unit. Each of the plurality of second layout units may have different resolutions and/or widths, respectively.

As the horizontal width of a layout unit decreases, the amount of information contained in the layout unit may decrease but the resolution of the layout unit may increase. Accordingly, as the horizontal width of a layout unit decreases, the number of pieces of input data to be learned by an AI model may increase and the resolution of the layout unit may also increase. The horizontal width and resolution of a second layout unit are described in detail with reference to FIG. 8.

Referring to FIG. 8, two first layouts Layout 1 and Layout 2 are illustrated. Each of the first layouts Layout 1 and Layout 2 may be converted into six second layouts. The second layouts in FIG. 8 may be referred to as first to sixth tiles or tile 1 to tile 6. Each of the six second layouts may respectively have first to sixth horizontal widths (scales).

Density may be calculated in each second layout. As the horizontal width of a second layout decreases, the density at each position of the second layout may be accurately calculated. Accordingly, as the horizontal width of a second layout decreases, the resolution of the second layout may increase. Accordingly, as the horizontal width of a second layout decreases, the AI model may precisely calculate information about a measurement target.

Referring back to FIG. 6, the offset data correction system 200 may classify data based on the measured data and the layout data in operation S260. For example, the offset data correction system 200 may classify data based on an element in each region, a proportion of the element in the region, the horizontal width of the region, an element adjacent to the region, and/or the refractive index of the region.

Referring back to FIG. 3, the semiconductor device 300 may include a first region A1 and a second region A2. The first region A1 may include the source/drain region 330 and the contact plug 350 and the second region A2 may include the nanosheet NS, the metal gate 310, and the upper interlayer insulating film 340. Because the elements included in the first region A1 are different from those included in the second region A2, post-processing of data of the semiconductor measuring device 100 about the first region A1 and the second region A2 may be required.

In particular, data may be classified according to the constituent materials of each of a topmost layer and a lower layer so as to generate an offset correction model. For example, data may be classified according to light transmittance to generate an offset correction model. For example, the second region A2 includes the upper interlayer insulating film 340 including silicon nitride. As described above, a silicon-based layer transmits light, so a lower layer may interfere with the light. Accordingly, the reliability of the data of the semiconductor measuring device 100 about the second region A2 may be relatively low. As described below, the offset data correction system 200 may classify the first region A1 and the second region A2 into different groups when generating an offset correction model.

The source/drain region 330 may have a first height H1 and the contact plug 350 may have a second height H2. An offset may be measured differently according to a ratio of the second height H2 to the first height H1 or according to a proportion of the source/drain region 330 and/or the contact plug 350 in the first region A1.

The metal gate 310 may have a third height H3 and the upper interlayer insulating film 340 may have a fourth height H4. An offset may be measured differently according to a ratio of the fourth height H4 to the third height H3 or according to a proportion of the metal gate 310 and/or the upper interlayer insulating film 340 in the second region A2.

Accordingly, the offset data correction system 200 may classify data according to the proportion of each element in each of the first and second regions A1 and A2 when generating a model. In other words, the offset data correction system 200 may classify data based on the density of each of the first and second regions A1 and A2 when generating an offset correction model.

The metal gate 310 may have a horizontal width $W_G$ in the horizontal direction (the X direction and/or the Y direction). An offset may be differently measured according to the horizontal width $W_G$ of the metal gate 310. Accordingly, the offset data correction system 200 may classify data based on the horizontal width $W_G$ of the metal gate 310 with respect to the first region A1 when generating an offset correction model.

The nanosheet NS may have a width $W_{NS}$ in the vertical direction (the Z direction). An offset may be differently measured according to the width $W_{NS}$ of the nanosheet NS. Accordingly, the offset data correction system 200 may classify data based on the width $W_{NS}$ of the nanosheet NS with respect to the first region A1 when generating an offset correction model.

In addition, an offset may be differently measured according to the type of semiconductor device 300 (e.g., n-channel metal oxide semiconductor (NMOS) or p-channel MOS (PMOS)). Accordingly, the offset data correction system 200 may classify data by the type of semiconductor device 300 when generating an offset correction model.

The amount of CMP may vary with an adjacent element. Accordingly, the offset data correction system 200 may classify data based on an adjacent element when generating an offset correction model.

The measurement result of the semiconductor measuring device 100 may also vary with the refractive index of a measurement target region. In other words, even when two measurement target regions have similar elements and similar heights, two pieces of data received by the semiconductor measuring device 100 respectively from the measurement target regions may be different from each other if the measurement target regions have different refractive indexes. Accordingly, the offset data correction system 200 may classify data based on the refractive index of a measurement target region when generating an offset correction model.

The offset data correction system 200 may classify data based on the spectrum of measured data when generating an offset correction model. The offset data correction system 200 may classify data based on information about a CMP process when generating an offset correction model. For example, the information about a CMP process may include the pressure, rotation speed, slurry flow rate, and/or over-polishing time in a region undergoing the CMP process.

Referring back to FIG. 5, the offset data correction system 200 may generate an offset correction model based on the pre-processed data in operation S300. The process of generating an offset correction model by using the offset data correction system 200 is described in detail with reference to FIG. 9.

Figure 9:
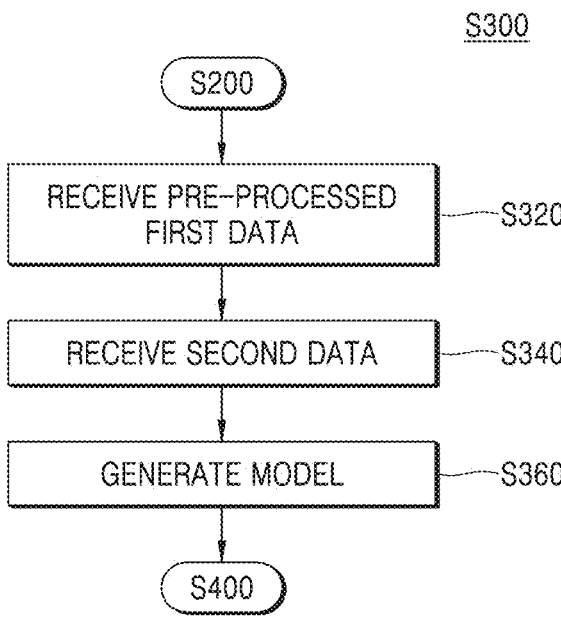
FIG. 9 is a flowchart of a process of generating an offset correction model, according to an embodiment.

FIG. 9 is a flowchart of a process of generating an offset correction model, according to an embodiment. FIG. 9 is described with reference to FIGS. 1 to 8.

Referring to FIG. 9, the offset data correction system 200 may receive pre-processed first data. As described above, the first data may include the measured data and the layout data. The first data may be pre-processed by combining the measure data with the layout data, converting the size of a layout unit, and classifying data. As described below, the first data may correspond to input data in the offset correction model.

Thereafter, the offset data correction system 200 may receive the second data that is the measured data of the semiconductor device 300 having the metal film ML formed thereon, in operation S340. As described above with reference to FIG. 4, the semiconductor measuring device 100 may obtain the second data by measuring the height and/or offset of the semiconductor device 300 after the metal film ML is formed on the upper region of the semiconductor device 300. As described below, the second data may correspond to output data of the offset correction model.

Thereafter, the offset data correction system 200 may generate the offset correction model in operation S360. For example, the offset correction model may include an AIbased model. For example, the offset correction model may include a machine learning-based model and/or a deep learning-based model.

The offset correction model may have the first data as input data and the second data as output data and may learn a method of connecting the first data with the second data. The offset correction model generated by the offset data correction system 200 may output the second data according to various variables of the first data described with reference to FIG. 6.

For example, the offset correction model may be based on an artificial neural network (ANN), a convolution neural network (CNN), a region with CNN (R-CNN), a region proposal network (RPN), a recurrent neural network (RNN), a generative adversarial network (GAN), a stacking-based deep neural network (S-DNN), a state-space dynamic neural network (S-SDNN), a deconvolution network, a deep belief network (DBN), a restricted Boltzman machine (RBM), a fully convolutional network, a long short-term memory (LSTM) network, a classification network, a plain residual network, a dense network, a hierarchical pyramid network, a transformer, and/or a vision transformation network.

Referring back to FIG. 5, the semiconductor device manufacturing apparatus 10 may evaluate the semiconductor device 300, based on the offset correction model, in operation S400. The semiconductor device manufacturing apparatus 10 may evaluate the semiconductor device 300, based on the difference between an offset (or a height) value at a particular position and an average offset (or height) value, the difference between the offset value at the particular position and an offset value of a reference region, and/or the difference between the offset value at the particular position and an offset value at an adjacent position.

When the semiconductor device 300 has satisfactory quality, the semiconductor device manufacturing apparatus 10 may perform a subsequent process on the semiconductor device 300. However, when the quality of the semiconductor device 300 is not acceptable, the semiconductor device manufacturing apparatus 10 may change the conditions of manufacturing processes for the semiconductor device 300. For example, the semiconductor device manufacturing apparatus 10 may change process conditions and/or equipment conditions.

In general, a semiconductor device manufacturing apparatus evaluates a CMP process after forming a metal film on a semiconductor device, as shown in FIG. 4. However, after the metal film is formed on the semiconductor device, the semiconductor device is measured using a destructive analysis method, and turnaround time (TAT) increases due to the additional process of forming the metal film.

However, the semiconductor device manufacturing apparatus 10 of the inventive concept may measure the semiconductor device 300 by using a nondestructive method after generating an offset correction model, without forming the metal film ML on the semiconductor device 300, and may input the first data into the offset correction model, thereby quickly and accurately evaluating a CMP process performed on the semiconductor device 300.

In addition, the offset data correction system 200 of the inventive concept may generate a conversion model between input data and output data by using an AI model. The input data may include the measured data and the layout data. By including the layout data as part of the input data, the conversion model may thus be generated taking into account the design of the semiconductor device 300.

Figures 10, 11:
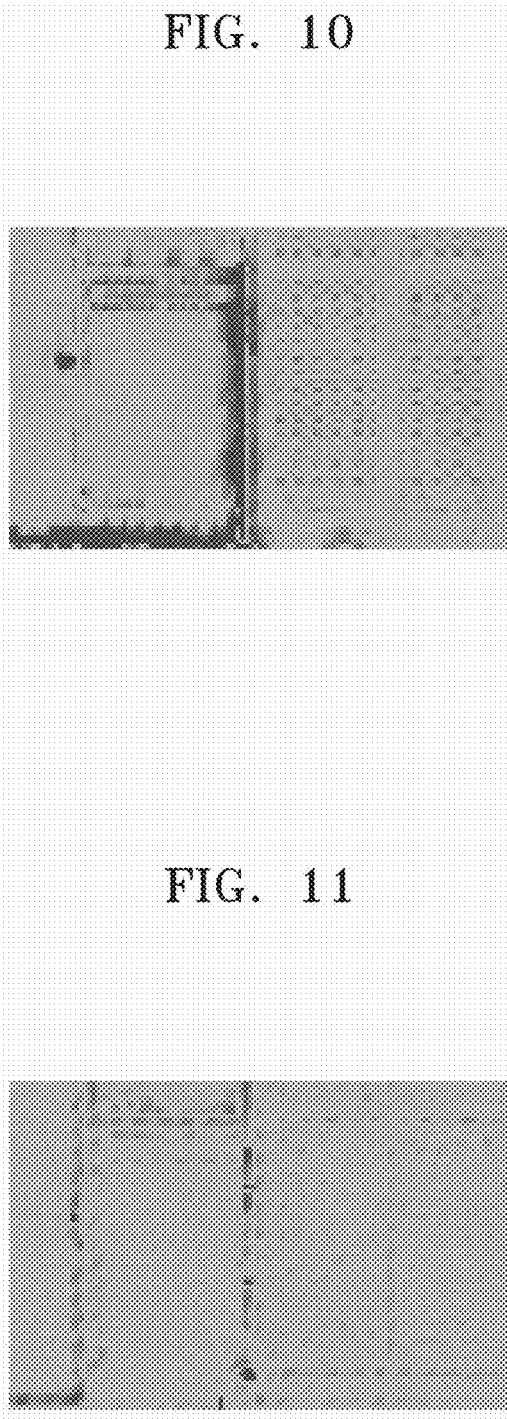
FIG. 10 illustrates a result of measuring a semiconductor device, on which a metal film is not formed, according to an embodiment.
FIG. 11 illustrates a result of measuring a semiconductor device, on which a metal film is formed, according to an embodiment.

FIG. 10 illustrates a result of measuring a semiconductor device, on which a metal film is not formed, according to an embodiment. FIG. 11 illustrates a result of measuring a semiconductor device, on which a metal film is formed, according to an embodiment. FIGS. 10 and 11 are described with reference to FIGS. 1 to 4 and FIG. 7.

Referring to FIGS. 10 and 11, the result of FIG. 10 may be different from the result of FIG. 11. As described above, when the topmost layer (e.g., the upper interlayer insulating film 340) includes silicon (Si), noise may occur due to an interference effect caused by a lower layer.

In addition, significant noise may occur in the scribe lane region SL. Accordingly, the chip region CR and the scribe lane region SL may be classified into different groups. This is not limited to the scribe lane region SL. For example, peripheral circuit devices (e.g., a photo key and an alignment key) may be classified into different groups. Because different regions of the semiconductor device 300 may be subject to different levels of noise, different offset correction models may be generated and used to evaluate different regions of the semiconductor device 300 based on the classified groups. For example, a first offset correction model may be generated and used for a first region (e.g., the chip region CR) and a second offset correction model may be generated and used for a second region (e.g., the scribe lane region SL). The first and second regions are not limited to the examples provided above.

Figure 12:
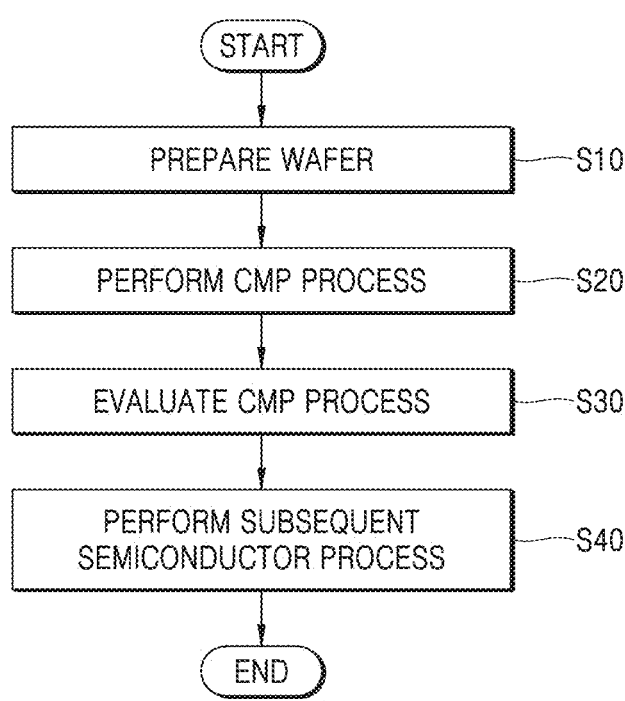
FIG. 12 is a flowchart of a semiconductor device manufacturing method using an offset correction model, according to an embodiment.

FIG. 12 is a flowchart of a semiconductor device manufacturing method using an offset correction model, according to an embodiment. FIG. 12 is described with reference to FIGS. 1 to 11.

Referring to FIG. 12, a wafer is prepared in operation S10. For example, the wafer may have undergone various processes. For example, a vapor deposition process may have already been performed on the wafer.

Thereafter, a CMP process may be performed on the wafer in operation S20. The CMP process may include planarizing the surface of a process target (e.g., a semiconductor device).

Thereafter, the CMP process performed in operation S20 may be evaluated in operation S30. The evaluation of the CMP process may include evaluating whether there is an abnormality in the semiconductor device after the CMP process.

The evaluation of the CMP process may include receiving data in operation S100, pre-processing the data in operation S200, generating an offset correction model in operation S300, and evaluating the semiconductor device in operation S400 in FIG. 5. The generating of the offset correction model in operation S300 may include receiving pre-processed first data in operation S320, receiving second data in operation S340, and generating the offset correction model in operation S360 of FIG. 9. When the result of the evaluation of the CMP process at operation S30 indicates that there is an abnormality in the CMP process, equipment conditions and/or process conditions may be changed.

After the evaluation of the CMP process, a subsequent semiconductor process may be performed on the wafer in operation S40. The subsequent semiconductor process may include various processes. For example, the subsequent semiconductor process may include oxidation, photolithography, vapor deposition, etching, ion implantation, and/or cleaning. The subsequent semiconductor process may also include a singulation process in which the wafer is singulated into semiconductor chips, a test process in which semiconductor chips are tested, and a packaging process in which a semiconductor chip is packaged. A semiconductor device may be completely formed through the subsequent semiconductor process on the wafer.

Figure 13:
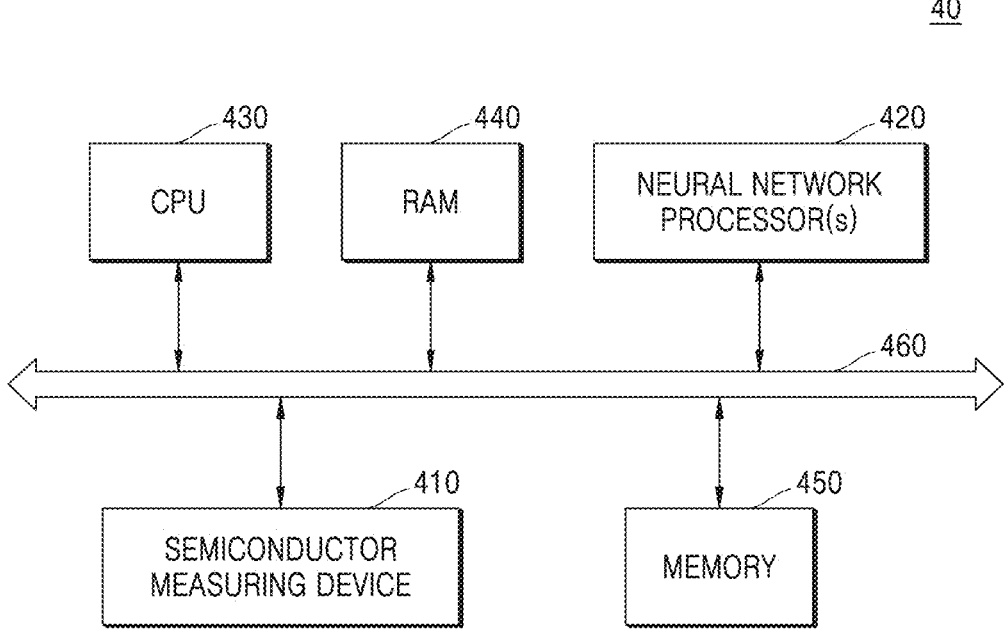
FIG. 13 is a block diagram of a semiconductor device manufacturing apparatus according to an embodiment.

FIG. 13 is a block diagram of a semiconductor device manufacturing apparatus according to an embodiment. FIG. 13 is described with reference to FIGS. 1 to 12.

Referring to FIG. 13, a semiconductor device manufacturing apparatus 40 may generate an offset correction model for a CMP process by using a neural network and determine whether there is an abnormality in the CMP process. The semiconductor device manufacturing apparatus 40 may include a semiconductor measuring device 410, a neural network processor 420, a central process unit (CPU) 430, random access memory (RAM) 440, a memory 450, and a bus 460.

According to an embodiment, the semiconductor device manufacturing apparatus 40 may further include general-use elements other than the elements illustrated in FIG. 13. For example, the semiconductor device manufacturing apparatus 40 may further include an input/output module, a security module, a power control device, etc. and various kinds of processors. According to an embodiment, at least one of the elements in FIG. 13 may be omitted from the semiconductor device manufacturing apparatus 40. The elements of the semiconductor device manufacturing apparatus 40 may communicate with each other through the bus 460.

The semiconductor measuring device 410 may measure the height and/or offset of a measurement target. For example, the semiconductor measuring device 410 may measure a measurement target that has undergone a CMP process.

The neural network processor 420 may train a neural network or infer information from input data by analyzing the input data using the neural network. The neural network processor 420 may determine a situation based on the inferred information or control the elements of an electronic device having the neural network system 100 mounted thereon.

The neural network processor 420 may receive input data from the semiconductor measuring device 410 and pre-process the input data, thereby generating data. The pre-processing operation may include combining measured data with layout data, converting the size of a layout, and classifying data.

The neural network processor 420 may receive first data and second data. The neural network processor 420 may generate an offset correction model, which has the first data as an input and the second data as an output. The neural network processor 420 may derive an offset conversion value for input data based on the offset correction model.

The neural network processor 420 may include a neural network operation accelerator, a coprocessor, a digital signal processor (DSP), an application specific integrated circuit (ASIC), a field-programmable gate array (FPGA), a graphics processing unit (GPU), a neural processing unit (NPU), a tensor processing unit (TPU), a multi-processor system-on-chip (MPSoC), or the like.

The neural network processor 420 may correspond to a neural network model, which is based on an ANN, a CNN, an R-CNN, an RPN, an RNN, a GAN, an S-DNN, an S-SDNN, a deconvolution network, a DBN, an RBM, a fully convolutional network, an LSTM network, a classification network, a plain residual network, a dense network, a hierarchical pyramid network, a transformer, and/or a vision transformation network. The kind of neural network models is not limited to those mentioned above.

The CPU 430 may generally control operations of the semiconductor device manufacturing apparatus 40. The CPU 430 may include a single core or multiple cores. The CPU 430 may process or execute programs and/or data, which are stored in a storage area such as the memory 450, by using the RAM 440.

For example, the CPU 430 may execute an application and control the neural network device 420 to perform neural network-based tasks involved in the execution of the application.

The memory 450 may include at least one of volatile memory and nonvolatile memory. Nonvolatile memory may include read-only memory (ROM), programmable ROM (PROM), electrically programmable ROM (EPROM), electrically erasable and programmable ROM (EEPROM), and flash memory, Volatile memory may include dynamic RAM (DRAM), static RAM (SRAM), synchronous DRAM (SDRAM), phase-change RAM (PRAM), magnetic RAM (MRAM), resistive RAM (RRAM), and ferroelectric RAM (FeRAM). In an embodiment, the memory 450 may include at least one selected from the group consisting of a hard disk drive (HDD), a solid state drive (SSD), a compact flash (CF) card, a secure digital (SD) card, a micro-SD card, a mini-SD card, an extreme digital (xD) card, and a memory stick.

While the inventive concept has been particularly shown and described with reference to embodiments thereof, it will be understood that various changes in form and details may be made therein without departing from the spirit and scope of the disclosure.

What is claimed is:

1. An offset data correction method comprising:
measuring a measurement target that has undergone a chemical mechanical polishing (CMP) process;
generating an offset correction model based on the measurement of the measurement target; and
using the offset correction model, correcting measured data obtained from the measurement of the measurement target,
wherein the offset correction model is trained by using the measured data and layout data of the measurement target as inputs.

2. The offset data correction method of claim 1, wherein the generating of the offset correction model includes:
receiving input data including the measured data and the layout data;
receiving output data obtained from a second measurement of the measurement target; and
generating a conversion model between the input data and the output data.

3. The offset data correction method of claim 2, wherein the input data is obtained by measuring the measurement target, and
the output data is obtained by measuring the measurement target after a layer is formed on the measurement target.

4. The offset data correction method of claim 3, wherein the layer includes metal.

5. The offset data correction method of claim 1, further comprising evaluating the CMP process based on the corrected measured data.

6. The offset data correction method of claim 5, wherein the evaluating of the CMP process includes comparing an offset value calculated by the offset correction model with at least one selected from the group consisting of an average offset value, an offset value of a reference region, and an offset value of an adjacent region.

7. The offset data correction method of claim 1, wherein the measuring of the measurement target includes measuring the measurement target by using an optical method, and
the offset correction model includes an artificial intelligence (AI) model.

8. An offset data correction method comprising:

measuring a measurement target that has undergone a chemical mechanical polishing (CMP) process;

pre-processing measured data obtained from the measurement of the measurement target;

generating an offset correction model based on the measured data; and correcting the measured data, wherein the pre-processing of the measured data includes:

combining the measured data with layout data of the measurement target;

converting a size of a layout unit of the layout data; and classifying the measured data and the layout data, and the offset correction model is trained by using the measured data and the layout data as inputs.

9. The offset data correction method of claim 8, wherein the measurement target includes a plurality of elements, and the layout data includes at least one piece of information selected from the group consisting of constituent materials, dimensions, shapes, contacts, and functions of each element of the plurality of elements.

10. The offset data correction method of claim 8, wherein the converting of the size of the layout unit includes converting a first layout unit into second layout units, the first layout unit having a size that is identical to a resolution of the measured data, and the second layout units having different sizes from each other.

11. The offset data correction method of claim 8, wherein the classifying of the measured data and the layout data is based on at least one selected from the group consisting of an element of each of a plurality of regions of the measurement target, a proportion of the element, a horizontal width of the element, a material adjacent to the element, and a refractive index of the element.

12. The offset data correction method of claim 8, wherein the classifying of the measured data and the layout data is based on at least one of a spectrum of the measured data and information about the CMP process.

13. The offset data correction method of claim 12, wherein the information about the CMP process includes at least one selected from the group consisting of a pressure, a rotation speed, a slurry flow rate, and an overpolishing time in a region undergoing the CMP process in the measurement target.

14. The offset data correction method of claim 8, wherein the classifying of the measured data and the layout data is based on constituent materials of each of a topmost layer and a lower layer of the measurement target.

15. The offset data correction method of claim 14, wherein the measured data and the layout data are classified based on light transmittance of the topmost layer.

16. The offset data correction method of claim 8, wherein the classifying of the measured data and the layout data includes classifying a chip region and a scribe lane region of the measurement target into different groups.

17. The offset data correction method of claim 8, wherein the offset correction model is based on at least one selected from the group consisting of a convolution neural network (CNN), a generative adversarial network (GAN), and a vision transformer network.

18. The offset data correction method of claim 8, wherein the measurement target is measured using a nondestructive method.

19. A semiconductor device manufacturing method comprising:

preparing a wafer;

performing a chemical mechanical polishing (CMP) process on the wafer;

evaluating the CMP process; and performing a subsequent semiconductor process on the wafer, wherein the evaluating of the CMP process includes:

measuring the wafer that has undergone the CMP process;

generating an offset correction model based on the measurement of the wafer; and using the offset correction model, correcting measured data obtained from the measurement of the wafer, wherein the offset correction model is trained by using measured data and layout data from another wafer as inputs.

20. The semiconductor device manufacturing method of claim 19, wherein input data of the offset correction model is the measured data and the layout data, and output data of the offset correction model is data obtained by measuring the wafer after a metal layer is formed on the wafer, and the offset correction model includes a conversion model between the input data and the output data.

\* \* \* \* \*